United States Patent
Berger (10) Patent No.: US 9,875,806 B2
(45) Date of Patent: Jan. 23, 2018

(54) FUSE-BASED INTEGRITY PROTECTION

(71) Applicant: Intel Corporation, Santa Clara, CA (US)

(72) Inventor: Michael Berger, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/443,624

(22) Filed: Feb. 27, 2017

(65) Prior Publication Data

US 2017/0178743 A1    Jun. 22, 2017

Related U.S. Application Data

(62) Division of application No. 14/978,698, filed on Dec. 22, 2015, now Pat. No. 9,583,210.

(51) Int. Cl.
    *G11C 17/00*  (2006.01)
    *G11C 17/18*  (2006.01)
    *G11C 17/16*  (2006.01)
    *G06F 3/06*   (2006.01)

(52) U.S. Cl.
    CPC ............ *G11C 17/18* (2013.01); *G06F 3/0619* (2013.01); *G06F 3/0655* (2013.01); *G06F 3/0679* (2013.01); *G11C 17/16* (2013.01)

(58) Field of Classification Search
    CPC ..................................................... G11C 17/16
    USPC .......................................................... 365/96
    See application file for complete search history.

(56) References Cited

U.S. PATENT DOCUMENTS

| | | |
|---|---|---|
| 9,583,210 B1 | 2/2017 | Berger |
| 2006/0239101 A1 | 10/2006 | Tanaka et al. |
| 2011/0035616 A1 | 2/2011 | Henry et al. |
| 2011/0035623 A1* | 2/2011 | Gaskins .................. G06F 11/10 714/15 |

OTHER PUBLICATIONS

"U.S. Appl. No. 14/979,698, Response filed Oct. 3, 2016 to Restriction Requirement dated Aug. 3, 2016", 7 pgs.
"U.S. Appl. No. 14/978,698, Notice of Allowance dated Oct. 13, 2016", 9 pgs.
"U.S. Appl. No. 14/978,698, Restriction Requirement dated Aug. 3, 2016", 5 pgs.

* cited by examiner

*Primary Examiner* — Hoai V Ho
(74) *Attorney, Agent, or Firm* — Schwegman Lundberg & Woessner, P.A.

(57) ABSTRACT

Various systems and methods for implementing fuse-based integrity protection are described herein. A system for validating a read-only memory (ROM), the system comprising a ROM reader logic, implemented at least partly in hardware, to: access a read-only memory (ROM) having a plurality of permanently programmable electric couplings (PPECs), the PPECs having been programmed; survey a number of permanently altered PPECs in the set of PPECs to produce a counter value; read a binary representation of the counter value from PPEC values stored as a PPEC signature; and read a binary representation of the binary complement of the counter value from PPEC values in the PPEC signature; and a ROM validation logic, implemented at least partly, in hardware, to verify the integrity of the ROM using a combination of at least two of: the counter value, the binary representation of the counter value, and the binary representation of the binary complement of the counter value.

20 Claims, 6 Drawing Sheets

FUSE-BASED INTEGRITY PROTECTION

PRIORITY APPLICATION

This application is a divisional of U.S. application Ser. No. 14/978,698, filed Dec. 22, 2015, which is incorporated herein by reference in its entirety.

TECHNICAL FIELD

Embodiments described herein generally relate to electrically programmable fuses and fabrication, and in particular, to fuse-based integrity protection.

BACKGROUND

Programmable read-only memory (PROM), field programmable read-only memory (FPROM), and one-time programmable non-volatile memory (OTP NVM) are types of digital read-only memory (ROM) where the setting of each bit is set by a fuse or an antifuse. In fuse-based technology, the fuse starts with a low resistance and is designed to permanently break an electrically conductive path when the current applied to the path exceeds a specified limit. Similarly, in antifuse technology, each antifuse starts with a high resistance and is designed to permanently create an electrically conductive path when voltage across the antifuse exceeds a specified limit. Each fuse or antifuse represents a digital bit, and burning specific fuses or antifuses creates digital data on the ROM. PROMs are manufactured blank and may be programmed at wafer, final test, or in system.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

In the following description, for purposes of explanation, numerous specific details are set forth in order to provide a thorough understanding of some example embodiments. It will be evident, however, to one skilled in the art that the present disclosure may be practiced without these specific details.

Systems and methods described herein implement fuse-based integrity protection. A security concern regarding high-volume manufacturing (HVM) fuses has been that, for any unfused bit, an attacker may potentially find a way to fuse that bit post-manufacturing, thereby modifying the chip's behavior. The previous best known method has been to observe that, if a certain fuse bit may have one value leading to a less secure behavior and one value leading to a more secure behavior, the value leading to the less secure behavior would be assigned to the "unfused" value, and the value leading to the more secure behavior would be assigned to the "fused" value. Using this design, an attacker may still modify the behavior of the chip, but only in the direction of making it more secure, thus taking the edge out of the attack. However, this approach has several issues.

One issue with the current method is that many fuse usages do not have a clear "more secure" and "less secure" setting. As an example, in the context of a PROM patch, where the fuses represent central processing unit (CPU) instructions, there is no clear "more secure" or "less secure" instruction; any change to instructions may compromise ROM security. Another issue is that efforts to program the ROM with a more secure/less secure paradigm may result in inefficient use of the ROM fuses. For example, if a group of ROM fuses is supposed to represent a numerical value, the more secure/less secure paradigm may entail using a less efficient unary representation of that numerical value instead of a more efficient binary representation of that numerical value. Furthermore, manual maintenance of fuse definitions is difficult with the more secure/less secure fuse definition scheme. Thus, what is needed is an efficient and effective mechanism to add integrity to fuse programming.

The present disclosure describes a mechanism to add a fuse signature to the ROM when the ROM is programmed. The fuse signature may be checked at runtime to ensure that the ROM has not been tampered with.

Figure 1:
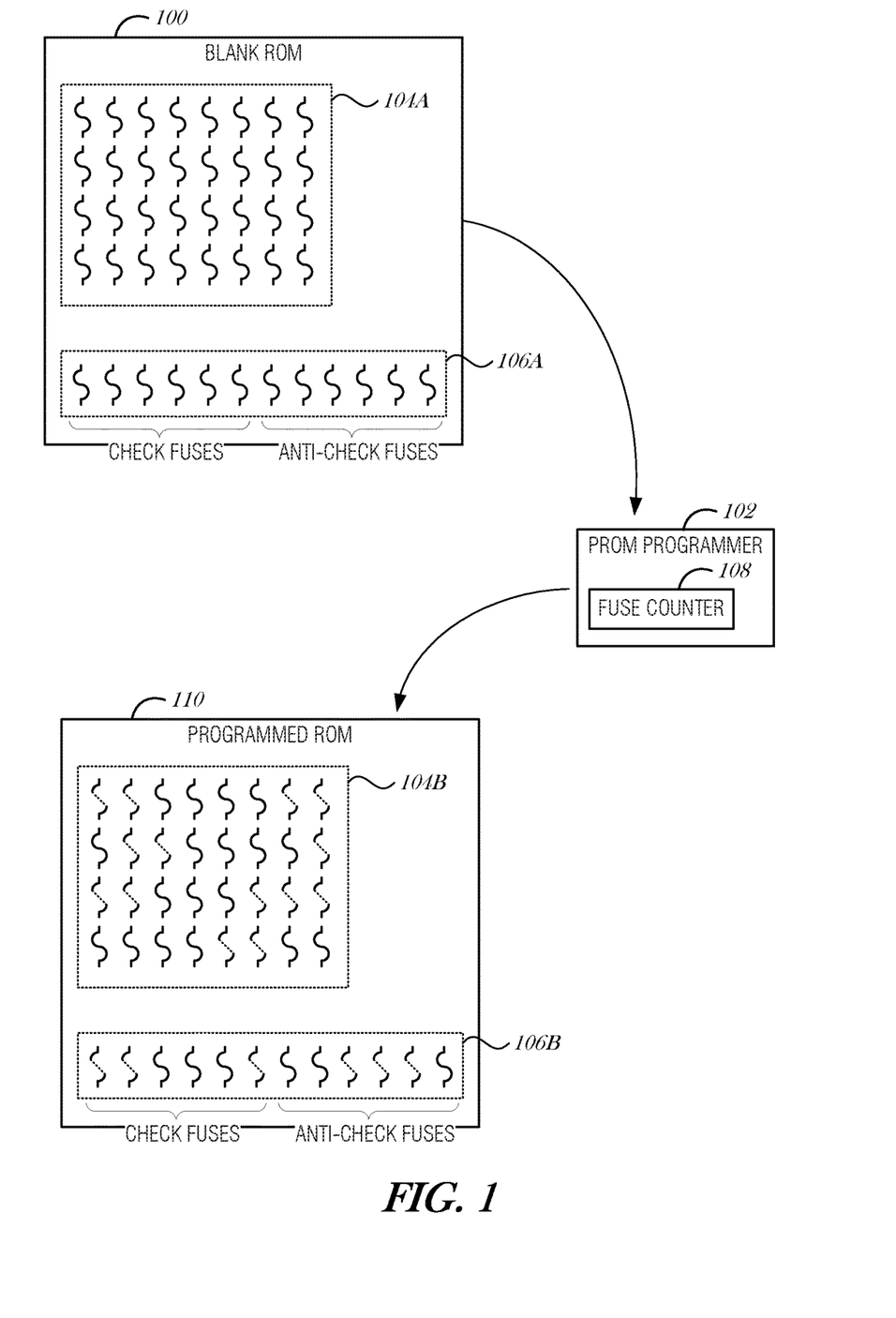
FIG. 1 is a data and control flow diagram illustrating a process to implement a fuse signature, according to an embodiment.

FIG. 1 is a data and control flow diagram illustrating a process to implement a fuse signature, according to an embodiment. A blank ROM 100 is programmed by a PROM programmer 102. The blank ROM 100 may be any type of read-only memory, including programmable read-only memory (PROM), field programmable read-only memory (FPROM), one-time programmable non-volatile memory (OTP NVM), erasable PROM (EPROM), or electrically erasable programmable read-only memory (EEPROM). The blank ROM 100 may be fuse-based on antifuse based. Although this discussion describes usage for a fuse-based ROM, it is understood that similar mechanisms may be used for antifuse-based ROMs.

In the example, an unburnt fuse is assumed to be associated with the binary value "1" because the fuse is conductive and allows a charge to pass through. When the fuse is burnt, the structure is altered to be non-conductive and then has a binary value of "0". Antifuses operate in the opposite manner. An antifuse is a structure that changes state from not conducting to conducting (e.g., from higher resistance to lower resistance) in response to electrical stress (e.g., programming voltage or current). Thus, in its initial state, an antifuse has a binary value of "0" and after being "blown" (e.g., "burnt") the antifuse is conductive and has a binary value of "1". While much of the present disclosure discusses examples in terms of a fuse based PROM, it is understood that variants using antifuses are within the scope of this disclosure.

The blank ROM 100 includes a number of fuses 104A in their initial state. In the example shown in FIG. 1 there are eight fuses. However, it is understood that many more fuses are likely to be included on a ROM, such as 1000 or more fuses (e.g., to accommodate a kilobit memory), a million or more fuses (e.g., to accommodate a megabit of memory), or the like. The thirty-two fuses 104 are used for illustration throughout this discussion.

In addition, the blank ROM 100 includes a number of check fuses 106A in their initial state. The number of check and anti-check fuses 106A may vary depending on the actual implementation. In the example illustrated in FIG. 1 there are twelve check and anti-check fuses 106A (e.g., six of each). The check fuses of 106A are used to represent the number of burnt fuses and the anti-check fuses of 106A represent the inverted bit string of the number of burnt fuses. In other words, the fuse signature provided by the check and anti-check fuses 106A is the binary representation of the number of burnt fuses (e.g., a value C) and the complement of the binary representation of the number of burnt fuses (e.g., !C).

A fuse map may be created offline and used to program the ROM. The fuse map may include the check and anti-check fuse values. Such values may be stored in a fuse array with other fuse values so that the PROM programmer 102 remains "dumb" and programs the counter and anti-counter values without knowing what the values are for.

Alternatively, as the PROM programmer 102 programs the blank ROM 100, the PROM programmer 102 keeps track of the number of fuses it burns to program the blank ROM 100. For each fuse the PROM programmer 102 burns in the blank ROM 100, the PROM programmer 102 increments a fuse counter 108. When the PROM programmer 102 is finished programming the blank ROM 100, the PROM programmer 102 writes the number of burnt fuses to the check fuses in the programmed ROM 110, and the complement of that number to the anti-check fuses in the programmed ROM 110.

In the example shown in FIG. 1, fourteen fuses are burnt in the resultant programmed ROM 110. As such, the binary representation of the value "14" is burnt into the first six check fuses 106B in binary form. The last six anti-check fuses 106B are used to store the inverted value of the first six check fuses 106B. In this case, the complement of the binary value "001110" is "110001", which is shown in FIG. 1 with the corresponding burnt/unburnt fuses. Depending on the implementation of the fuses, an unburnt fuse may be associated with a binary value of "0", in which case, the binary representation would be inverted from that shown here.

Using this mechanism, a malicious user is unable to alter both the recorded number of burnt fuses (e.g., first six check fuses 106B) and the complement of that recorded number (e.g., last six anti-check fuses 106B) in a manner that keeps them as number and complement, as it is impossible to "unburn" a fuse once is has been burned.

When the fuse pool 104 is processed, such as when the fuse controller hardware senses these fuses from the programmed ROM 110 and copies them (e.g., to an internal static random-access memory (SRAM)), the following checks may be made: 1) that the number of burnt fuses matches the number represented in the check fuses 106B and 2) that the check fuses is equal to the NOT of the anti-check fuses (or similarly that the anti-check fuses is equal to the NOT of the check fuses).

This mechanism is efficient in terms of fuse consumption and is also scalable. If the total number of fuses is N, this solution requires adding only $2 \times [1+\log_2 N]$ fuses. For example, if there are 1 Kb fuses total in the fuse pool, the total possible number of burnt fuses is 1 Kb+1, meaning the counter may be represented by eleven fuses. The complement of the counter has the same number, resulting in a total of twenty-two extra fuses over that used for storage. Similarly, total 1 Mb fuses require only an extra forty-two fuses, and 1 Gb fuses require only sixty-two extra fuses. Note that this is even less than the number of fuses that would be required to use modern hash functions that are considered adequately secure (e.g., SHA-128).

It is possible to generalize this mechanism, such as by using any other injective function on the burnt fuses instead of a direct count of burnt fuses. The result of that function is then stored and its complement is also stored in fuse values. As an example, an injective mapping function may be:

$x = N+50$ if $0 <= N <= 954$ $x = N-955$ if $955 <= N <= 1024$ where N is the number of burnt fuses. In such an example, the value of x may be stored in the check fuses as a binary number along with the binary complement in the anti-check fuses.

Additionally, while the present disclosure discusses counting the number of burnt fuses, it is understood that the number of unburnt fuses may be maintained instead, then after programming the number of unburnt fuses may be stored in the check fuses, along with the binary complement in the anti-check fuses, as a fuse signature.

Figure 2:
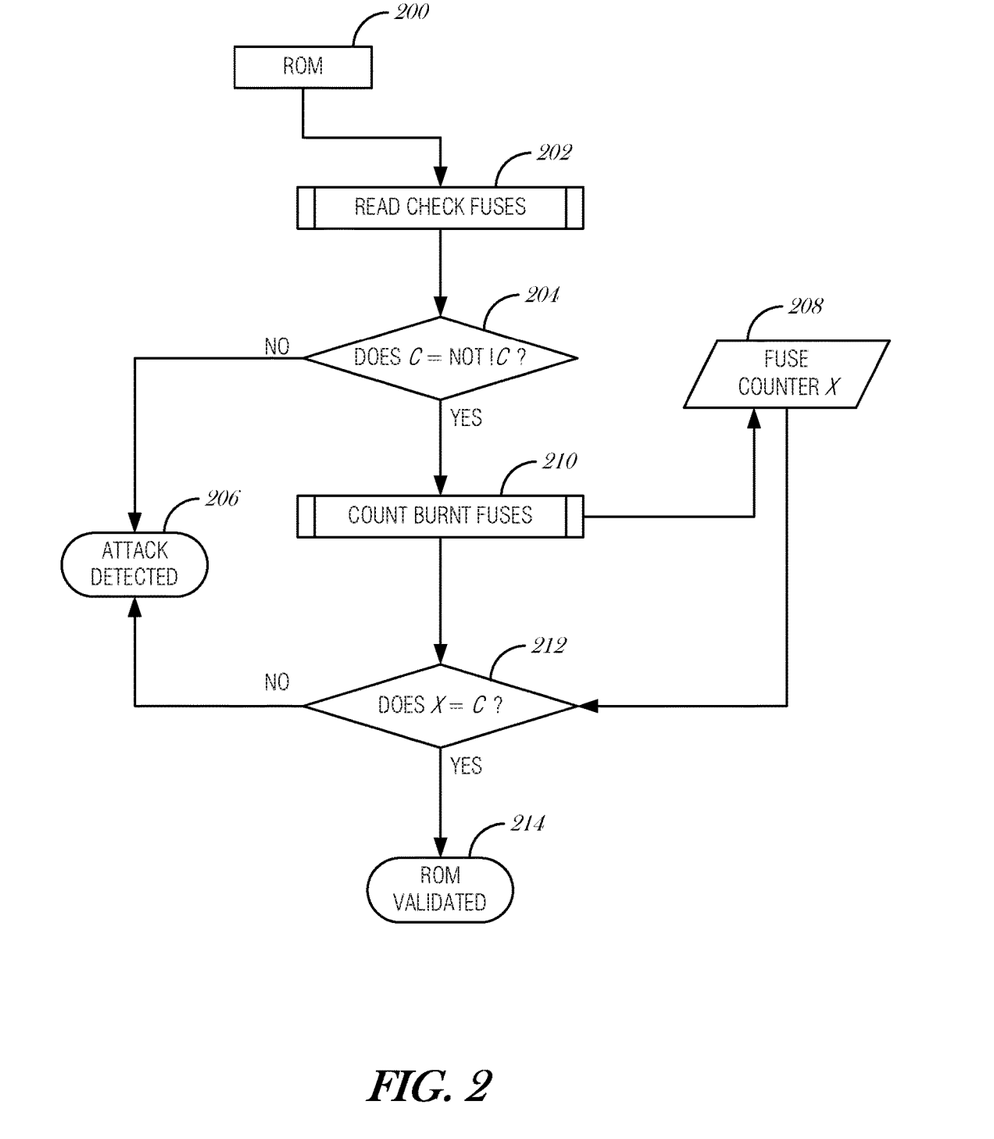
FIG. 2 is a data and control flow diagram illustrating a process for validating ROM, according to an embodiment.

FIG. 2 is a data and control flow diagram illustrating a process for validating ROM, according to an embodiment. In operation 202, a fuse controller may read the check fuses of a ROM 200. At decision block 204, the value representing the number of burnt fuses is compared to the inverse of the complement of the value representing the number of burnt fuses. Let C be the representation of burnt fuses from the check fuses, and !C is the representation of the complement of C, appearing in the anti-check fuses. Continuing the example from above, C=001110 and !C=110001. The binary inverse of !C is then 001110, which matches C. Similarly, the binary inverse of C is 110001, which matches the !C value. As such, the determination at decision block 204 may be to determine whether NOT C=!C. Had a person tampered with either C or !C, the comparison would fail and an attack would be detected (state 206).

If the first check passes, then the fuse controller may continue and read the fuses from ROM to SRAM, for example. For each block of fuses copied from ROM, a fuse counter X (data 208) is maintained where X is the number of burnt fuses counted in the copy (operation 210). The fuse counter 208 may be stored in a register on the fuse controller. After copying the fuses from ROM, the fuse controller compares the number of burnt fuses detected while copying X with the number of expected burnt fuses C (decision block 212). If the values do not match, then an attack is detected (state 206) and the processing is terminated. Otherwise, the ROM is considered validated (state 214).

With these two checks the ROM may be validated against two types of attacks. Assume an attacker burns an extra fuse. The attacker has two choices, either increment the check fuse value C to match the new total number of fuses burnt or not increment C.

Assume that the attacker increments C to match the new total number of fuses. This is only possible if one or more of C's fuses can change from "unburnt" to "burnt" state (as by definition no fuse can change from "burnt" to "unburnt").

However, even if this can be done so that the number of fuses burnt is correctly represented by a modified C, the attacker cannot change the corresponding fuses in !C from "burnt" to "unburnt." Thus, the first check at operation 204 will detect such an attack. If the attacker decides not to increment C, then the second check at operation 212 will detect such an attack.

Figure 3:
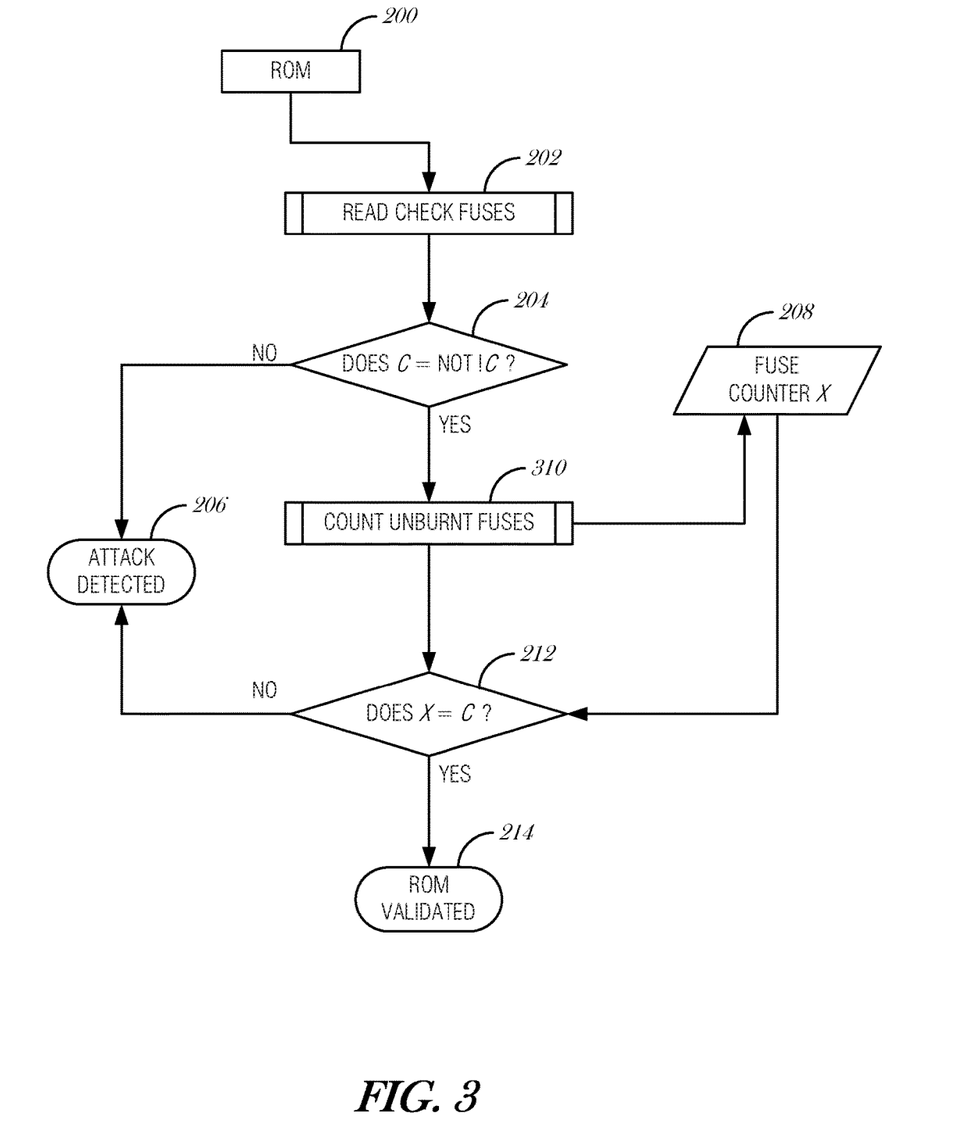
FIG. 3 is a data and control flow diagram illustrating a process for validating ROM, according to an embodiment.

FIG. 3 is a data and control flow diagram illustrating a process for validating ROM, according to an embodiment. The flow is similar to that illustrated in FIG. 2, however, instead of storing the number of burnt fuses in ROM 200, the number of unburnt fuses is stored. The check for whether C=NOT(!C) (decision block 204) is the same. Instead of counting the number of burnt fuses, at operation 310 the fuse controller keeps track of the number of unburnt fuses as it is reading the ROM's memory and stores it in the fuse counter 208.

Figure 4:
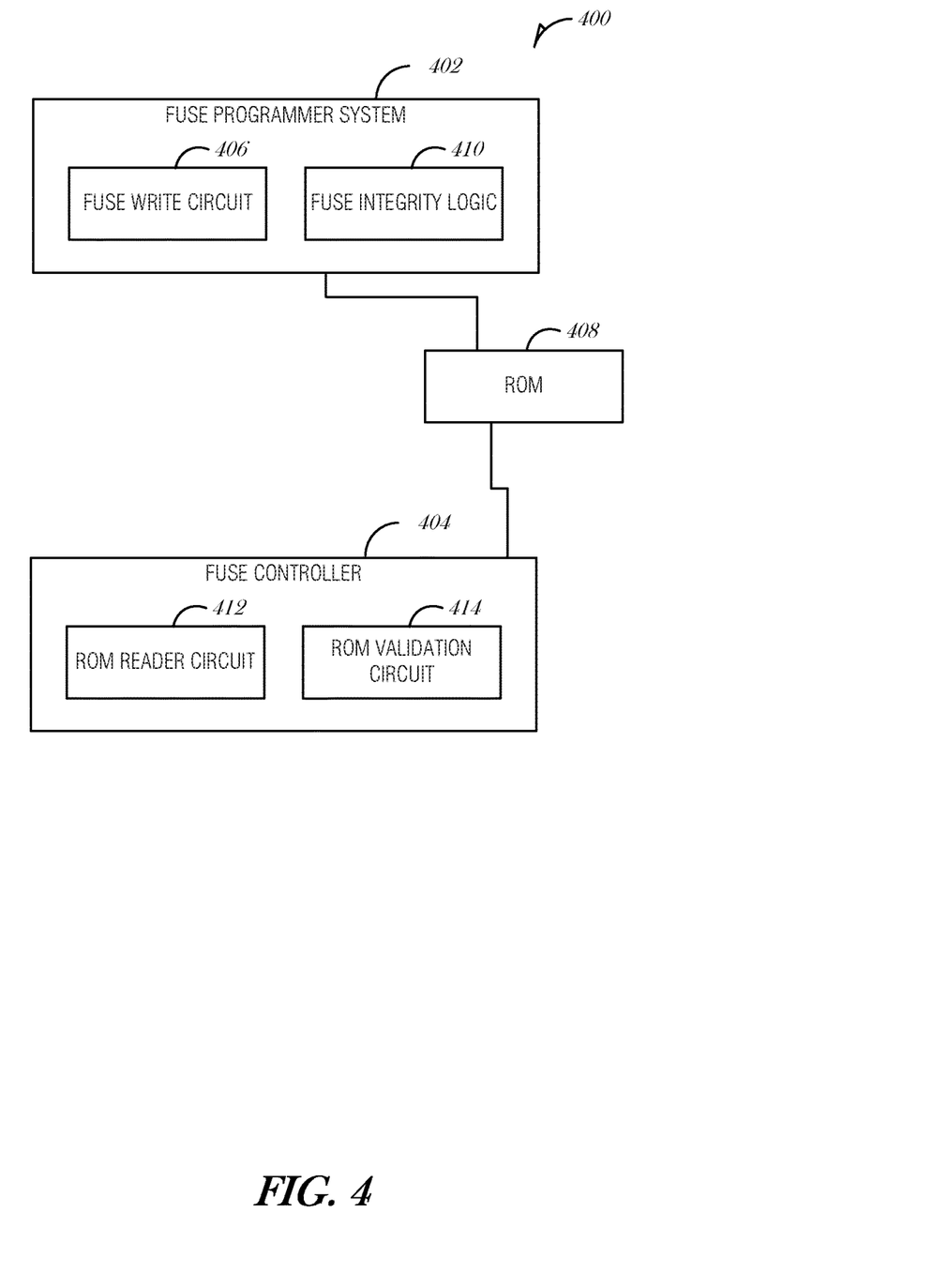
FIG. 4 is a block diagram illustrating a system for implementing fuse-based integrity protection, according to an embodiment.

FIG. 4 is a block diagram illustrating a system 400 for implementing fuse-based integrity protection, according to an embodiment. The system includes a fuse programmer system 402 and a fuse controller 404. In general, the fuse programmer system 402 is used to program a blank ROM by selectively applying electrical current or voltage to a fuse or antifuse to blow the fuse/antifuse, thereby using an irreversible process to create specific electrical pathways. While a fuse programmer is described here, it is understood that any apparatus that is able to selectively blow fuses/antifuses in a programmable ROM is encompassed by the present disclosure.

The fuse controller 404 is generally used to read a fuse or antifuse-based ROM and store its contents to readily-accessible memory, such as an SRAM module, which is accessed by other components of a system-on-chip (SoC), motherboard, riser board, or the like. Although the present disclosure refers to a fuse controller 404, it is understood that any mechanism that is able to read a fuse-based or antifuse-based ROM is encompassed by the scope of this discussion. For example, a wireless radio unit and a USB controller may each include their own PROM with configuration information and their own respective PROM controllers to read the PROM contents.

In an embodiment, the fuse programmer system 402 comprises a fuse write logic 406, implemented at least partly in hardware, to access a read-only memory (ROM) 408 having a plurality of permanently programmable electric couplings (PPECs), all of the PPECs in an initial state. In an embodiment, the ROM comprises a programmable read-only memory (PROM). In another embodiment, the ROM comprises a field programmable read-only memory (FPROM). In another embodiment, the ROM comprises a one-time programmable non-volatile memory (OTP NVM).

In an embodiment, the PPEC comprises a fuse. In such an embodiment, the counter value represents a number of fuses blown as a result of the selectively applied electricity. In another embodiment, the counter value represents a number of fuses not blown as a result of the selectively applied electricity.

In an embodiment, the PPEC comprises an antifuse. In such an embodiment, the counter value represents a number of antifuses blown as a result of the selectively applied electricity. In another embodiment, the counter value represents a number of antifuses not blown as a result of the selectively applied electricity.

The fuse write logic 406 may selectively apply electricity to modify a set of PPECs of the plurality of PPECs from the initial state to a permanently altered state. In an embodiment, to store the binary representation of the counter value in a PPEC signature, the fuse write logic 406 is to store the number of fuses blown. The PPEC signature may include various information to validate the integrity of the ROM.

The fuse programmer system 402 includes a fuse integrity logic 410, implemented at least partly in hardware, to survey the number of permanently altered PPECs in the set of PPECs to produce a counter value. The fuse integrity logic 410 may then direct the fuse write logic 406 to store a binary representation of the counter value as PPEC values in a PPEC signature and store a binary representation of the binary complement of the counter value as PPEC values in the PPEC signature.

In an embodiment, the fuse integrity logic 410 includes software running offline, which may be on a separate or remote machine, to produce the full fuse map including check and anti-check fuses. In another embodiment, the fuse write logic 406 and fuse integrity logic 410 are incorporated into the same machine.

In an embodiment, to store the binary representation of the counter value in a PPEC signature, the fuse integrity logic 410 is to evaluate an injective function that maps the number of fuses blown to a resultant value and direct the fuse write logic 406 to store the resultant value in the PPEC signature.

After the ROM is programmed, it may then be accessed to obtain the contents stored thereon. Thus, the fuse controller 404 may act as a system for validating a ROM and include a ROM reader logic 412, implemented at least partly in hardware, and a ROM validation logic 414, implemented at least partly in hardware.

The ROM reader logic 412 may be configured to access a read-only memory (ROM) 408 having a plurality of permanently programmable electric couplings (PPECs), the PPECs having been programmed. In embodiments, the ROM 408 comprises a programmable read-only memory (PROM), a field programmable read-only memory (FPROM), or a one-time programmable non-volatile memory (OTP NVM). Other types of programmable ROM is considered within the scope of this disclosure.

In an embodiment, the PPEC comprises a fuse. In such an embodiment, the counter value represents a number of fuses blown as a result of the selectively applied electricity. In another embodiment, the counter value represents a number of fuses not blown as a result of the selectively applied electricity.

In an embodiment, the PPEC comprises an antifuse. In such an embodiment, the counter value represents a number of antifuses blown as a result of the selectively applied electricity. In another embodiment, the counter value represents a number of antifuses not blown as a result of the selectively applied electricity.

Further, the ROM reader logic 412 may survey a number of permanently altered PPECs in the set of PPECs to produce a counter value. For example, the ROM reader logic 412 may maintain a counter value while reading the contents of the ROM 408 where a binary value of "1" is understood as being an unburnt fuse and a binary value of "0" is understood to be a burnt fuse. The counter value may be used to keep track of burnt fuses or unburnt fuses, depending on the implementation. Whether a binary value of "1" indicates a burnt or unburnt fuse may also depend on the fuse technology implemented.

The ROM reader logic 412 may read a binary representation of the counter value from PPEC values stored as a PPEC signature and read a binary representation of the binary complement of the counter value from PPEC values in the PPEC signature.

The ROM validation logic 414 may verify the integrity of the ROM using a combination of at least two of: the counter value, the binary representation of the counter value, and the binary representation of the binary complement of the counter value. For example, as described above with respect to FIG. 2, the ROM validation logic 414 may compare the binary representation of the counter value and its complement's complement to determine whether they match (e.g., operation 204 of FIG. 2). As another example, the ROM validation logic 414 may compare the number of burnt fuses with the number obtained from the binary representation of the counter value (e.g., operation 212 of FIG. 2).

In an embodiment, to verify the integrity of the ROM, the ROM validation logic 414 is to verify the integrity of the ROM binary representation of the counter value equals the complement of the binary representation of the binary complement of the counter value.

In an embodiment, the counter value represents the number of fuses blown, and to verify the integrity of the ROM, the ROM validation logic 414 is to verify the integrity of the ROM when the binary representation of the counter value in the PPEC signature equals the counter value.

In an embodiment, the counter value represents the number of fuses not blown, and to verify the integrity of the ROM, the ROM validation logic 414 is to verify the integrity of the ROM when the binary representation of the counter value in the PPEC signature equals the counter value.

In an embodiment, the counter value represents the number of antifuses blown, and to verify the integrity of the ROM, the ROM validation logic 414 is to verify the integrity of the ROM when the binary representation of the counter value in the PPEC signature equals the counter value.

In an embodiment, the counter value represents the number of antifuses not blown, and to verify the integrity of the ROM, the ROM validation logic 414 is to verify the integrity of the ROM when the binary representation of the counter value in the PPEC signature equals the counter value.

In an embodiment, the counter value represents the resultant value of an injective function that maps the number of fuses blown to the resultant value, and to verify the integrity of the ROM, the ROM validation logic 414 is to count the number of fuses blown in the ROM, apply the injective function to obtain a test resultant value, and verify the integrity of the ROM when the binary representation of the counter value in the PPEC signature equals the test resultant value.

Figure 5:
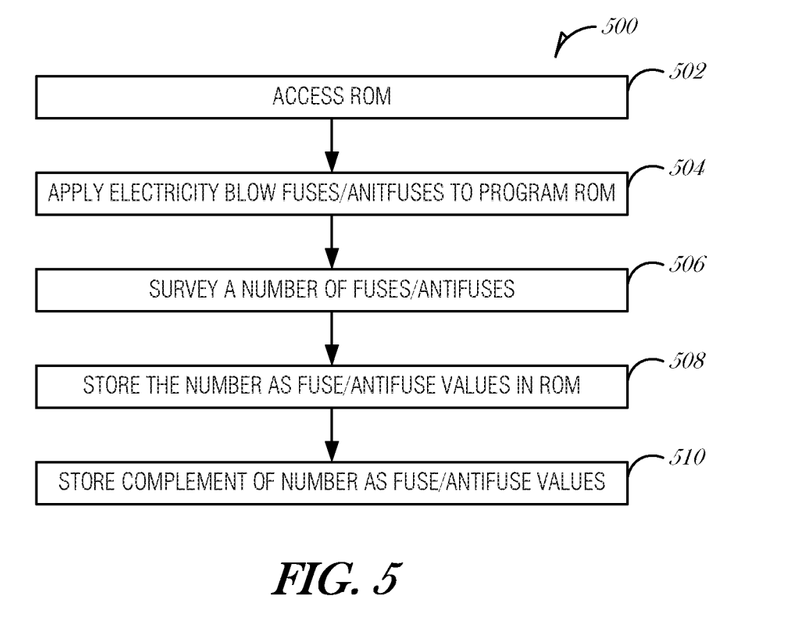
FIG. 5 is a flowchart illustrating a method of implementing fuse-based integrity protection, according to an embodiment.

FIG. 5 is a flowchart illustrating a method 500 of implementing fuse-based integrity protection, according to an embodiment. At block 502, a read-only memory (ROM) having a plurality of permanently programmable electric couplings (PPECs) is accessed, where all of the PPECs are in an initial state (e.g., factory fresh). In embodiments, the ROM comprises a programmable read-only memory (PROM), a field programmable read-only memory (FPROM), or a one-time programmable non-volatile memory (OTP NVM).

In an embodiment, the PPEC comprises a fuse. In such an embodiment, the counter value represents a number of fuses blown as a result of the selectively applied electricity. In another embodiment, the counter value represents a number of fuses not blown as a result of the selectively applied electricity.

In an embodiment, the PPEC comprises an antifuse. In such an embodiment, the counter value represents a number of antifuses blown as a result of the selectively applied electricity. In another embodiment, the counter value represents a number of antifuses not blown as a result of the selectively applied electricity.

At block 504, electricity is selectively applied to modify a set of PPECs of the plurality of PPECs from the initial state to a permanently altered state.

At block 506, the number of permanently altered PPECs in the set of PPECs is surveyed to produce a counter value.

At block 508, a binary representation of the counter value is stored as PPEC values in a PPEC signature.

At block 510, a binary representation of the binary complement of the counter value is stored as PPEC values in the PPEC signature.

In an embodiment, storing the binary representation of the counter value in a PPEC signature comprises storing the number of fuses blown.

In an embodiment, storing the binary representation of the counter value in a PPEC signature comprises evaluating an injective function that maps the number of fuses blown to a resultant value and storing the resultant value in the PPEC signature.

Figure 6:
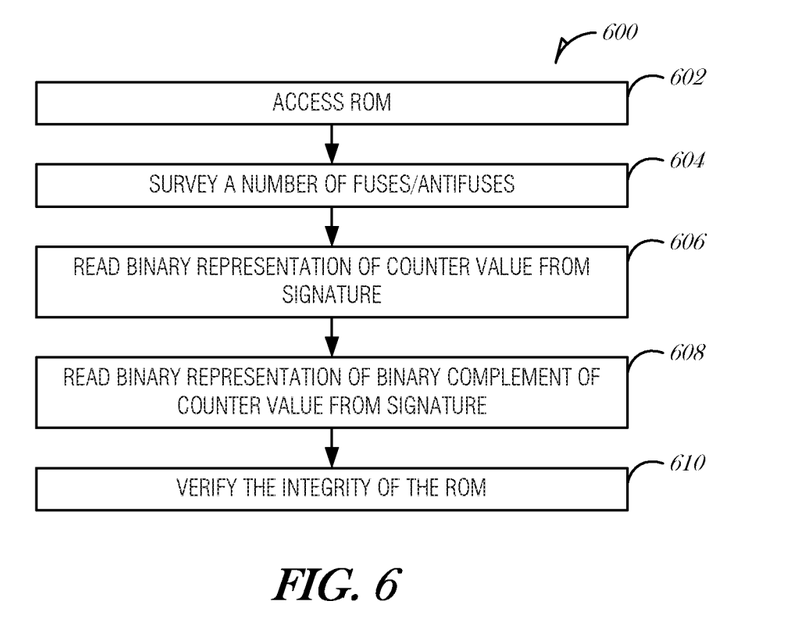
FIG. 6 is a flowchart illustrating a method of validating a read-only memory (ROM), according to an embodiment.

FIG. 6 is a flowchart illustrating a method 600 of validating a read-only memory (ROM), according to an embodiment. At block 602, a read-only memory (ROM) having a plurality of permanently programmable electric couplings (PPECs) is accessed, where the PPECs have been programmed.

In embodiments, the ROM comprises a programmable read-only memory (PROM), a field programmable read-only memory (FPROM), or a one-time programmable non-volatile memory (OTP NVM).

In an embodiment, the PPEC comprises a fuse. In such an embodiment, the counter value represents a number of fuses blown as a result of the selectively applied electricity. In another embodiment, the counter value represents a number of fuses not blown as a result of the selectively applied electricity.

In an embodiment, the PPEC comprises an antifuse. In such an embodiment, the counter value represents a number of antifuses blown as a result of the selectively applied electricity. In another embodiment, the counter value represents a number of antifuses not blown as a result of the selectively applied electricity.

At block 604, a number of permanently altered PPECs in the set of PPECs are surveyed to produce a counter value.

At block 606, a binary representation of the counter value is read from PPEC values stored as a PPEC signature. At block 608, a binary representation of the binary complement of the counter value is read from PPEC values in the PPEC signature.

At block 610, the integrity of the ROM is verified using a combination of at least two of: the counter value, the binary representation of the counter value, and the binary representation of the binary complement of the counter value.

In an embodiment, verifying the integrity of the ROM comprises verifying the integrity of the ROM binary representation of the counter value equals the complement of the binary representation of the binary complement of the counter value.

In an embodiment, the counter value represents the number of fuses blown, and verifying the integrity of the ROM comprises verifying the integrity of the ROM when the binary representation of the counter value in the PPEC signature equals the counter value.

In an embodiment, the counter value represents the number of fuses not blown, and verifying the integrity of the ROM comprises verifying the integrity of the ROM when the binary representation of the counter value in the PPEC signature equals the counter value.

In an embodiment, the counter value represents the number of antifuses blown, and verifying the integrity of the ROM comprises verifying the integrity of the ROM when the binary representation of the counter value in the PPEC signature equals the counter value.

In an embodiment, the counter value represents the number of antifuses not blown, and verifying the integrity of the ROM comprises verifying the integrity of the ROM when the binary representation of the counter value in the PPEC signature equals the counter value.

In an embodiment, the counter value represents the resultant value of an injective function that maps the number of fuses blown to the resultant value, and verifying the integrity of the ROM comprises counting the number of fuses blown in the ROM, applying the injective function to obtain a test resultant value, and verifying the integrity of the ROM when the binary representation of the counter value in the PPEC signature equals the test resultant value.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

A processor subsystem may be used to execute the instruction on the machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, logic or circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Figure 7:
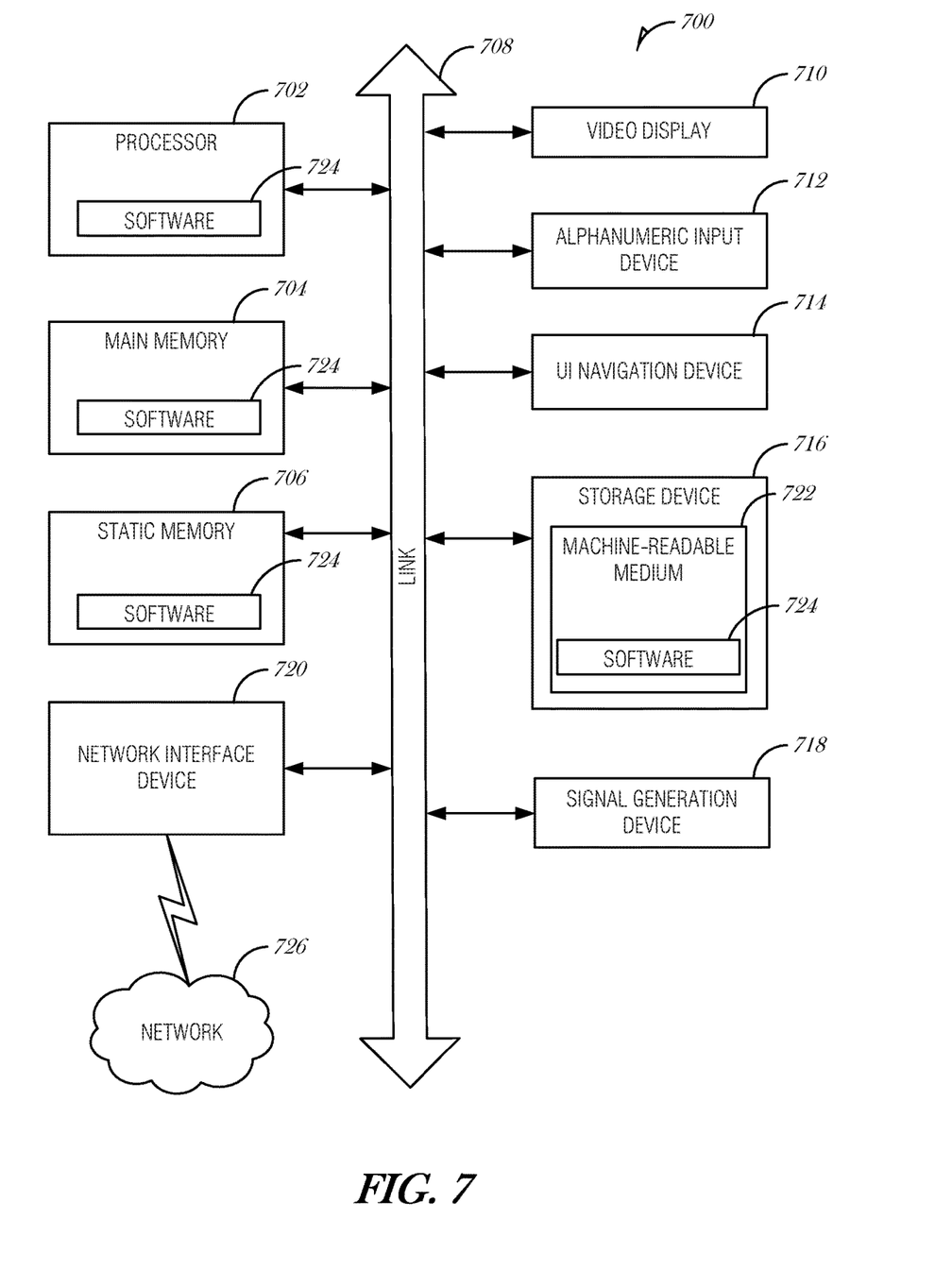
FIG. 7 is a block diagram illustrating an example machine upon which any one or more of the techniques (e.g., methodologies) discussed herein may perform, according to an example embodiment.

FIG. 7 is a block diagram illustrating a machine in the example form of a computer system 700, within which a set or sequence of instructions may be executed to cause the machine to perform any one of the methodologies discussed herein, according to an example embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be an onboard vehicle system, wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 700 includes at least one processor 702 (e.g., a central processing unit (CPU), a graphics processing unit (GPU) or both, processor cores, compute nodes, etc.), a main memory 704 and a static memory 706, which communicate with each other via a link 708 (e.g., bus). The computer system 700 may further include a video display unit 710, an alphanumeric input device 712 (e.g., a keyboard), and a user interface (UI) navigation device 714 (e.g., a mouse). In one embodiment, the video display unit 710, input device 712 and UI navigation device 714 are incorporated into a touch screen display. The computer system 700 may additionally include a storage device 716 (e.g., a drive unit), a signal generation device 718 (e.g., a speaker), a network interface device 720, and one or more sensors (not shown), such as a global positioning system (GPS) sensor, compass, accelerometer, or other sensor.

The storage device 716 includes a machine-readable medium 722 on which is stored one or more sets of data structures and instructions 724 (e.g., software) embodying or utilized by any one or more of the methodologies or functions described herein. The instructions 724 may also reside, completely or at least partially, within the main memory 704, static memory 706, and/or within the processor 702 during execution thereof by the computer system 700, with the main memory 704, static memory 706, and the processor 702 also constituting machine-readable media.

While the machine-readable medium 722 is illustrated in an example embodiment to be a single medium, the term "machine-readable medium" may include a single medium or multiple media (e.g., a centralized or distributed database, and/or associated caches and servers) that store the one or more instructions 724. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 724 may further be transmitted or received over a communications network 726 using a transmission medium via the network interface device 720 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Additional Notes & Examples:

Example 1 is a fuse programmer system for implementing fuse-based integrity protection, the system comprising: a fuse write logic, implemented at least partly in hardware, to: access a read-only memory (ROM) having a plurality of permanently programmable electric couplings (PPECs), all of the PPECs in an initial state; and selectively apply electricity to modify a set of PPECs of the plurality of PPECs from the initial state to a permanently altered state; and a fuse integrity logic to: survey the number of permanently altered PPECs in the set of PPECs to produce a counter value; and direct the fuse write logic to: store a binary representation of the counter value as PPEC values in a PPEC signature; and store a binary representation of the binary complement of the counter value as PPEC values in the PPEC signature.

In Example 2, the subject matter of Example 1 optionally includes, wherein the ROM comprises a programmable read-only memory (PROM).

In Example 3, the subject matter of any one or more of Examples 1-2 optionally include, wherein the ROM comprises a field programmable read-only memory (FPROM).

In Example 4, the subject matter of any one or more of Examples 1-3 optionally include, wherein the ROM comprises a one-time programmable non-volatile memory (OTP NVM).

In Example 5, the subject matter of any one or more of Examples 1-4 optionally include, wherein the PPEC comprises a fuse.

In Example 6, the subject matter of Example 5 optionally includes, wherein the counter value represents a number of fuses blown as a result of the selectively applied electricity.

In Example 7, the subject matter of any one or more of Examples 5-6 optionally include, wherein the counter value represents a number of fuses not blown as a result of the selectively applied electricity.

In Example 8, the subject matter of any one or more of Examples 1-7 optionally include, wherein the PPEC comprises an antifuse.

In Example 9, the subject matter of Example 8 optionally includes, wherein the counter value represents a number of antifuses blown as a result of the selectively applied electricity.

In Example 10, the subject matter of any one or more of Examples 8-9 optionally include, wherein the counter value represents a number of antifuses not blown as a result of the selectively applied electricity.

In Example 11, the subject matter of any one or more of Examples 1-10 optionally include, wherein to store the binary representation of the counter value in a PPEC signature, the fuse write logic is to store the number of fuses blown.

In Example 12, the subject matter of any one or more of Examples 1-11 optionally include, wherein to store the binary representation of the counter value in a PPEC signature, the fuse integrity logic is to: evaluate an injective function that maps the number of fuses blown to a resultant value; and direct the fuse write logic to store the resultant value in the PPEC signature.

Example 13 is a method of implementing fuse-based integrity protection, the method comprising: accessing a read-only memory (ROM) having a plurality of permanently programmable electric couplings (PPECs), all of the PPECs in an initial state; selectively applying electricity to modify a set of PPECs of the plurality of PPECs from the initial state to a permanently altered state; surveying the number of permanently altered PPECs in the set of PPECs to produce a counter value; storing a binary representation of the counter value as PPEC values in a PPEC signature; and storing a binary representation of the binary complement of the counter value as PPEC values in the PPEC signature.

In Example 14, the subject matter of Example 13 optionally includes, wherein the ROM comprises a programmable read-only memory (PROM).

In Example 15, the subject matter of any one or more of Examples 13-14 optionally include, wherein the ROM comprises a field programmable read-only memory (FPROM).

In Example 16, the subject matter of any one or more of Examples 13-15 optionally include, wherein the ROM comprises a one-time programmable non-volatile memory (OTP NVM).

In Example 17, the subject matter of any one or more of Examples 13-16 optionally include, wherein the PPEC comprises a fuse.

In Example 18, the subject matter of Example 17 optionally includes, wherein the counter value represents a number of fuses blown as a result of the selectively applied electricity.

In Example 19, the subject matter of any one or more of Examples 17-18 optionally include, wherein the counter value represents a number of fuses not blown as a result of the selectively applied electricity.

In Example 20, the subject matter of any one or more of Examples 13-19 optionally include, wherein the PPEC comprises an antifuse.

In Example 21, the subject matter of Example 20 optionally includes, wherein the counter value represents a number of antifuses blown as a result of the selectively applied electricity.

In Example 22, the subject matter of any one or more of Examples 20-21 optionally include, wherein the counter value represents a number of antifuses not blown as a result of the selectively applied electricity.

In Example 23, the subject matter of any one or more of Examples 13-22 optionally include, wherein storing the binary representation of the counter value in a PPEC signature comprises storing the number of fuses blown.

In Example 24, the subject matter of any one or more of Examples 13-23 optionally include, wherein storing the binary representation of the counter value in a PPEC signature comprises: evaluating an injective function that maps the number of fuses blown to a resultant value; and storing the resultant value in the PPEC signature.

Example 25 is at least one machine-readable medium including instructions, which when executed by a machine, cause the machine to perform operations of any of the methods of Examples 13-24.

Example 26 is an apparatus comprising means for performing any of the methods of Examples 13-24.

Example 27 is an apparatus for implementing fuse-based integrity protection, the apparatus comprising: means for accessing a read-only memory (ROM) having a plurality of permanently programmable electric couplings (PPECs), all of the PPECs in an initial state; means for selectively applying electricity to modify a set of PPECs of the plurality of PPECs from the initial state to a permanently altered state; means for surveying the number of permanently altered PPECs in the set of PPECs to produce a counter value; means for storing a binary representation of the counter value as PPEC values in a PPEC signature; and means for storing a binary representation of the binary complement of the counter value as PPEC values in the PPEC signature.

In Example 28, the subject matter of Example 27 optionally includes, wherein the ROM comprises a programmable read-only memory (PROM).

In Example 29, the subject matter of any one or more of Examples 27-28 optionally include, wherein the ROM comprises a field programmable read-only memory (FPROM).

In Example 30, the subject matter of any one or more of Examples 27-29 optionally include, wherein the ROM comprises a one-time programmable non-volatile memory (OTP NVM).

In Example 31, the subject matter of any one or more of Examples 27-30 optionally include, wherein the PPEC comprises a fuse.

In Example 32, the subject matter of Example 31 optionally includes, wherein the counter value represents a number of fuses blown as a result of the selectively applied electricity.

In Example 33, the subject matter of any one or more of Examples 31-32 optionally include, wherein the counter value represents a number of fuses not blown as a result of the selectively applied electricity.

In Example 34, the subject matter of any one or more of Examples 27-33 optionally include, wherein the PPEC comprises an antifuse.

In Example 35, the subject matter of Example 34 optionally includes, wherein the counter value represents a number of antifuses blown as a result of the selectively applied electricity.

In Example 36, the subject matter of any one or more of Examples 34-35 optionally include, wherein the counter value represents a number of antifuses not blown as a result of the selectively applied electricity.

In Example 37, the subject matter of any one or more of Examples 27-36 optionally include, wherein the means for storing the binary representation of the counter value in a PPEC signature comprise means for storing the number of fuses blown.

In Example 38, the subject matter of any one or more of Examples 27-37 optionally include, wherein the means for storing the binary representation of the counter value in a PPEC signature comprise: means for evaluating an injective function that maps the number of fuses blown to a resultant value; and means for storing the resultant value in the PPEC signature.

Example 39 is a system for implementing fuse-based integrity protection, the system comprising: a processor subsystem; and a memory including instructions, which when executed by the processor subsystem, cause the processor subsystem to: access a read-only memory (ROM) having a plurality of permanently programmable electric couplings (PPECs), all of the PPECs in an initial state; selectively apply electricity to modify a set of PPECs of the plurality of PPECs from the initial state to a permanently altered state; survey the number of permanently altered PPECs in the set of PPECs to produce a counter value; store a binary representation of the counter value as PPEC values in a PPEC signature; and store a representation of the binary complement of the counter value as PPEC values in the PPEC signature.

In Example 40, the subject matter of Example 39 optionally includes, wherein the ROM comprises a programmable read-only memory (PROM).

In Example 41, the subject matter of any one or more of Examples 39-40 optionally include, wherein the ROM comprises a field programmable read-only memory (FPROM).

In Example 42, the subject matter of any one or more of Examples 39-41 optionally include, wherein the ROM comprises a one-time programmable non-volatile memory (OTP NVM).

In Example 43, the subject matter of any one or more of Examples 39-42 optionally include, wherein the PPEC comprises a fuse.

In Example 44, the subject matter of Example 43 optionally includes, wherein the counter value represents a number of fuses blown as a result of the selectively applied electricity.

In Example 45, the subject matter of any one or more of Examples 43-44 optionally include, wherein the counter value represents a number of fuses not blown as a result of the selectively applied electricity.

In Example 46, the subject matter of any one or more of Examples 39-45 optionally include, wherein the PPEC comprises an antifuse.

In Example 47, the subject matter of Example 46 optionally includes, wherein the counter value represents a number of antifuses blown as a result of the selectively applied electricity.

In Example 48, the subject matter of any one or more of Examples 46-47 optionally include, wherein the counter value represents a number of antifuses not blown as a result of the selectively applied electricity.

In Example 49, the subject matter of any one or more of Examples 39-48 optionally include, wherein the instructions to store the binary representation of the counter value in a PPEC signature comprise instructions to store the number of fuses blown.

In Example 50, the subject mater of any one or more of Examples 39-49 optionally include, wherein the instructions to store the binary representation of the counter value in a PPEC signature instructions to: evaluate an injective function that maps the number of fuses blown to a resultant value; and store the resultant value in the PPEC signature.

Example 51 is a system for validating a read-only memory (ROM), the system comprising: a ROM reader logic, implemented at least partly in hardware, to: access a read-only memory (ROM) having a plurality of permanently programmable electric couplings (PPECs), the PPECs having been programmed; survey a number of permanently altered PPECs in the set of PPECs to produce a counter value; read a binary representation of the counter value from PPEC values stored as a PPEC signature; and read a binary representation of the binary complement of the counter value from PPEC values in the PPEC signature; and a ROM validation logic, implemented at least partly in hardware, to verify the integrity of the ROM using a combination of at least two of: the counter value, the binary representation of the counter value, and the binary representation of the binary complement of the counter value.

In Example 52, the subject matter of Example 51 optionally includes, wherein the ROM comprises a programmable read-only memory (PROM).

In Example 53, the subject matter of any one or more of Examples 51-52 optionally include, wherein the ROM comprises a field programmable read-only memory (FPROM).

In Example 54, the subject matter of any one or more of Examples 51-53 optionally include, wherein the ROM comprises a one-time programmable non-volatile memory (OTP NVM).

In Example 55, the subject matter of any one or more of Examples 51-54 optionally include, wherein the PPEC comprises a fuse.

In Example 56, the subject matter of Example 55 optionally includes, wherein the counter value represents a number of fuses blown as a result of the selectively applied electricity.

In Example 57, the subject matter of any one or more of Examples 55-56 optionally include, wherein the counter value represents a number of fuses not blown as a result of the selectively applied electricity.

In Example 58, the subject matter of any one or more of Examples 51-57 optionally include, wherein the PPEC comprises an antifuse.

In Example 59, the subject matter of Example 58 optionally includes, wherein the counter value represents a number of antifuses blown as a result of the selectively applied electricity.

In Example 60, the subject matter of any one or more of Examples 58-59 optionally include, wherein the counter value represents a number of antifuses not blown as a result of the selectively applied electricity.

In Example 61, the subject matter of any one or more of Examples 51-60 optionally include, wherein to verify the integrity of the ROM, the ROM validation logic is to verify the integrity of the ROM binary representation of the counter value equals the complement of the binary representation of the binary complement of the counter value.

In Example 62, the subject matter of any one or more of Examples 51-61 optionally include, wherein the counter value represents the number of fuses blown, and wherein to verify the integrity of the ROM, the ROM validation logic is to verify the integrity of the ROM when the binary representation of the counter value in the PPEC signature equals the counter value.

In Example 63, the subject matter of any one or more of Examples 51-62 optionally include, wherein the counter value represents the number of fuses not blown, and wherein to verify the integrity of the ROM, the ROM validation logic is to verify the integrity of the ROM when the binary representation of the counter value in the PPEC signature equals the counter value.

In Example 64, the subject matter of any one or more of Examples 51-63 optionally include, wherein the counter value represents the number of antifuses blown, and wherein to verify the integrity of the ROM, the ROM validation logic is to verify the integrity of the ROM when the binary representation of the counter value in the PPEC signature equals the counter value.

In Example 65, the subject matter of any one or more of Examples 51-64 optionally include, wherein the counter value represents the number of antifuses not blown, and wherein to verify the integrity of the ROM, the ROM validation logic is to verify the integrity of the ROM when the binary representation of the counter value in the PPEC signature equals the counter value.

In Example 66, the subject matter of any one or more of Examples 51-65 optionally include, wherein the counter value represents the resultant value of an injective function that maps the number of fuses blown to the resultant value, and wherein to verify the integrity of the ROM, the ROM validation logic is to: count the number of fuses blown in the ROM; apply the injective function to obtain a test resultant value; and verify the integrity of the ROM when the binary representation of the counter value in the PPEC signature equals the test resultant value.

Example 67 is a method of validating a read-only memory (ROM), the method comprising: accessing a read-only memory (ROM) having a plurality of permanently programmable electric couplings (PPECs), the PPECs having been programmed; surveying a number of permanently altered PPECs in the set of PPECs to produce a counter value; reading a binary representation of the counter value from PPEC values stored as a PPEC signature; reading a binary representation of the binary complement of the counter value from PPEC values in the PPEC signature; and verifying the integrity of the ROM using a combination of at least two of: the counter value, the binary representation of the counter value, and the binary representation of the binary complement of the counter value.

In Example 68, the subject matter of Example 67 optionally includes, wherein the ROM comprises a programmable read-only memory (PROM).

In Example 69, the subject matter of any one or more of Examples 67-68 optionally include, wherein the ROM comprises a field programmable read-only memory (FPROM).

In Example 70, the subject matter of any one or more of Examples 67-69 optionally include, wherein the ROM comprises a one-time programmable non-volatile memory (OTP NVM).

In Example 71, the subject matter of any one or more of Examples 67-70 optionally include, wherein the PPEC comprises a fuse.

In Example 72, the subject matter of Example 71 optionally includes, wherein the counter value represents a number of fuses blown as a result of the selectively applied electricity.

In Example 73, the subject matter of any one or more of Examples 71-72 optionally include, wherein the counter value represents a number of fuses not blown as a result of the selectively applied electricity.

In Example 74, the subject matter of any one or more of Examples 67-73 optionally include, wherein the PPEC comprises an antifuse.

In Example 75, the subject matter of Example 74 optionally includes, wherein the counter value represents a number of antifuses blown as a result of the selectively applied electricity.

In Example 76, the subject matter of any one or more of Examples 74-75 optionally include, wherein the counter value represents a number of antifuses not blown as a result of the selectively applied electricity.

In Example 77, the subject matter of any one or more of Examples 67-76 optionally include, wherein verifying the integrity of the ROM comprises verifying the integrity of the ROM binary representation of the counter value equals the complement of the binary representation of the binary complement of the counter value.

In Example 78, the subject matter of any one or more of Examples 67-77 optionally include, wherein the counter value represents the number of fuses blown, and wherein verifying the integrity of the ROM comprises verifying the integrity of the ROM when the binary representation of the counter value in the PPEC signature equals the counter value.

In Example 79, the subject matter of any one or more of Examples 67-78 optionally include, wherein the counter value represents the number of fuses not blown, and wherein verifying the integrity of the ROM comprises verifying the integrity of the ROM when the binary representation of the counter value in the PPEC signature equals the counter value.

In Example 80, the subject matter of any one or more of Examples 67-79 optionally include, wherein the counter value represents the number of antifuses blown, and wherein verifying the integrity of the ROM comprises verifying the integrity of the ROM when the binary representation of the counter value in the PPEC signature equals the counter value.

In Example 81, the subject matter of any one or more of Examples 67-80 optionally include, wherein the counter value represents the number of antifuses not blown, and wherein verifying the integrity of the ROM comprises verifying the integrity of the ROM when the binary representation of the counter value in the PPEC signature equals the counter value.

In Example 82, the subject matter of any one or more of Examples 67-81 optionally include, wherein the counter value represents the resultant value of an injective function that maps the number of fuses blown to the resultant value, and wherein verifying the integrity of the ROM comprises: counting the number of fuses blown in the ROM; applying the injective function to obtain a test resultant value; and verifying the integrity of the ROM when the binary representation of the counter value in the PPEC signature equals the test resultant value.

Example 83 is at least one machine-readable medium including instructions, which when executed by a machine, cause the machine to perform operations of any of the methods of Examples 67-82.

Example 84 is an apparatus comprising means for performing any of the methods of Examples 67-82.

Example 85 is an apparatus for validating a read-only memory (ROM), the apparatus comprising: means for accessing a read-only memory (ROM) having a plurality of permanently programmable electric couplings (PPECs), the PPECs having been programmed; means for surveying a number permanently altered PPECs in the set of PPECs to produce a counter value; means for reading a binary representation of the counter value from PPEC values stored as a PPEC signature; means for reading a binary representation of the binary complement of the counter value from PPEC values in the PPEC signature; and means for verifying the integrity of the ROM using a combination of at least two of: the counter value, the binary representation of the counter value, and the binary representation of the binary complement of the counter value.

In Example 86, the subject matter of Example 85 optionally includes, wherein the ROM comprises a programmable read-only memory (PROM).

In Example 87, the subject matter of any one or more of Examples 85-86 optionally include, wherein the ROM comprises a field programmable read-only memory (FPROM).

In Example 88, the subject matter of any one or more of Examples 85-87 optionally include, wherein the ROM comprises a one-time programmable non-volatile memory (OTP NVM).

In Example 89, the subject matter of any one or more of Examples 85-88 optionally include, wherein the PPEC comprises a fuse.

In Example 90, the subject matter of Example 89 optionally includes, wherein the counter value represents a number of fuses blown as a result of the selectively applied electricity.

In Example 91, the subject matter of any one or more of Examples 89-90 optionally include, wherein the counter value represents a number of fuses not blown as a result of the selectively applied electricity.

In Example 92, the subject matter of any one or more of Examples 85-91 optionally include, wherein the PPEC comprises an antifuse.

In Example 93, the subject matter of Example 92 optionally includes, wherein the counter value represents a number of antifuses blown as a result of the selectively applied electricity.

In Example 94, the subject matter of any one or more of Examples 92-93 optionally include, wherein the counter value represents a number of antifuses not blown as a result of the selectively applied electricity.

In Example 95, the subject matter of any one or more of Examples 85-94 optionally include, wherein the means for verifying the integrity of the ROM comprise means for verifying the integrity of the ROM binary representation of the counter value equals the complement of the binary representation of the binary complement of the counter value.

In Example 96, the subject matter of any one or more of Examples 85-95 optionally include, wherein the counter value represents the number of fuses blown, and wherein the means for verifying the integrity of the ROM comprise means for verifying the integrity of the ROM when the binary representation of the counter value in the PPEC signature equals the counter value.

In Example 97, the subject matter of any one or more of Examples 85-96 optionally include, wherein the counter value represents the number of fuses not blown, and wherein the means for verifying the integrity of the ROM comprise means for verifying the integrity of the ROM when the binary representation of the counter value in the PPEC signature equals the counter value.

In Example 98, the subject matter of any one or more of Examples 85-97 optionally include, wherein the counter value represents the number of antifuses blown, and wherein the means for verifying the integrity of the ROM comprise means for verifying the integrity of the ROM when the binary representation of the counter value in the PPEC signature equals the counter value.

In Example 99, the subject matter of any one or more of Examples 85-98 optionally include, wherein the counter value represents the number of antifuses not blown, and wherein the means for verifying the integrity of the ROM comprise means for verifying the integrity of the ROM when the binary representation of the counter value in the PPEC signature equals the counter value.

In Example 100, the subject matter of any one or more of Examples 85-99 optionally include, wherein the counter value represents the resultant value of an injective function that maps the number of fuses blown to the resultant value, and wherein the means for verifying the integrity of the ROM comprise: means for counting the number of fuses blown in the ROM; means for applying the injective function to obtain a test resultant value; and means for verifying the integrity of the ROM when the binary representation of the counter value in the PPEC signature equals the test resultant value.

Example 101 is a system for validating a read-only memory (ROM), the system comprising: a processor subsystem; and a memory including instructions, which when executed by the processor subsystem, cause the processor subsystem to: access a read-only memory (ROM) having a plurality of permanently programmable electric couplings (PPECs), the PPECs having been programmed; survey a number of permanently altered PPECs in the set of PPECs to produce a counter value; read a binary representation of the counter value from PPEC values stored as a PPEC signature; read a binary representation of the binary complement of the counter value from PPEC values in the PPEC signature; and verify the integrity of the ROM using a combination of at least two of: the counter value, the binary representation of the counter value, and the binary representation of the binary complement of the counter value.

In Example 102, the subject matter of Example 101 optionally includes, wherein the ROM comprises a programmable read-only memory (PROM).

In Example 103, the subject matter of any one or more of Examples 101-102 optionally include, wherein the ROM comprises a field programmable read-only memory (FPROM).

In Example 104, the subject flatter of any one or more of Examples 101-103 optionally include, wherein the ROM comprises a one-time programmable non-volatile memory (OTP NVM).

In Example 105, the subject matter of any one or more of Examples 101-104 optionally include, wherein the PPEC comprises a fuse.

In Example 106, the subject matter of Example 105 optionally includes, wherein the counter value represents a number of fuses blown as a result of the selectively applied electricity.

In Example 107, the subject flatter of any one or more of Examples 105-106 optionally include, wherein the counter value represents a number of fuses not blown as a result of the selectively applied electricity.

In Example 108, the subject matter of any one or more of Examples 101-107 optionally include, wherein the PPEC comprises an antifuse.

In Example 109, the subject matter of Example 108 optionally includes, wherein the counter value represents a number of antifuses blown as a result of the selectively applied electricity.

In Example 110, the subject matter of any one or more of Examples 108-109 optionally include, wherein the counter value represents a number of antifuses not blown as a result of the selectively applied electricity.

In Example 111, the subject matter of any one or more of Examples 101-110 optionally include, wherein the instructions to verify the integrity of the ROM comprise instructions to verify the integrity of the ROM binary representation of the counter value equals the complement of the binary representation of the binary complement of the counter value.

In Example 112, the subject matter of any one or more of Examples 101-111 optionally include, wherein the counter value represents the number of fuses blown, and wherein the instructions to verify the integrity of the ROM comprise instructions to verify the integrity of the ROM when the binary representation of the counter value in the PPEC signature equals the counter value.

In Example 113, the subject matter of any one or more of Examples 101-112 optionally include, wherein the counter value represents the number of fuses not blown, and wherein the instructions to verify the integrity of the ROM comprise instructions to verify the integrity of the ROM when the binary representation of the counter value in the PPEC signature equals the counter value.

In Example 114, the subject matter of any one or more of Examples 101-113 optionally include, wherein the counter value represents the number of antifuses blown, and wherein the instructions to verify the integrity of the ROM comprise instructions to verify the integrity of the ROM when the binary representation of the counter value in the PPEC signature equals the counter value.

In Example 115, the subject matter of any one or more of Examples 101-114 optionally include, wherein the counter value represents the number of antifuses not blown, and wherein the instructions to verify the integrity of the ROM comprise instructions to verify the integrity of the ROM when the binary representation of the counter value in the PPEC signature equals the counter value.

In Example 116, the subject matter of any one or more of Examples 101-115 optionally include, wherein the counter value represents the resultant value of an injective function that maps the number of fuses blown to the resultant value, and wherein the instructions to verify the integrity of the ROM comprise instructions to: count the number of fuses blown in the ROM; apply the injective function to obtain a test resultant value; and verify the integrity of the ROM when the binary representation of the counter value in the PPEC signature equals the test resultant value.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A fuse programmer system for implementing fuse-based integrity protection, the system comprising:
   a fuse write logic, implemented at least partly in hardware, to:
      access a read-only memory (ROM) having a plurality of permanently programmable electric couplings (PPECs), all of the PPECs in an initial state; and
      selectively apply electricity to modify a set of PPECs of the plurality of PPECs from the initial state to a permanently altered state; and
   a fuse integrity logic to:
      survey the number of permanently altered PPECs in the set of PPECs to produce a counter value; and
      direct the fuse write logic to:
         store a binary representation of the counter value as PPEC values in a PPEC signature; and
         store a binary representation of the binary complement of the counter value as PPEC values in the PPEC signature.

2. The system of claim 1, wherein the PPEC comprises a fuse.

3. The system of claim 2, wherein the counter value represents a number of fuses blown as a result of the selectively applied electricity.

4. The system of claim 2, wherein the counter value represents a number of fuses not blown as a result of the selectively applied electricity.

5. The system of claim 1, wherein to store the binary representation of the counter value in a PPEC signature, the fuse write logic is to store the number of fuses blown.

6. The system of claim 1, wherein to store the binary representation of the counter value in a PPEC signature, the fuse integrity logic is to:
   evaluate an injective function that maps the number of fuses blown to a resultant value; and
   direct the fuse write logic to store the resultant value in the PPEC signature.

7. A method of implementing fuse-based integrity protection, the method comprising:
   accessing a read-only memory (ROM) having a plurality of permanently programmable electric couplings (PPECs), all of the PPECs in an initial state;
   selectively applying electricity to modify a set of PPECs of the plurality of PPECs from the initial state to a permanently altered state;
   surveying the number of permanently altered PPECs in the set of PPECs to produce a counter value;
   storing a binary representation of the counter value as PPEC values in a PPEC signature; and
   storing a binary representation of the binary complement of the counter value as PPEC values in the PPEC signature.

8. The method of claim 7, wherein the ROM comprises a programmable read-only memory (PROM).

9. The method of claim 7, wherein the ROM comprises a field programmable read-only memory (FPROM).

10. The method of claim 7, wherein the ROM comprises a one-time programmable non-volatile memory (OTP NVM).

11. The method of claim 7, wherein the PPEC comprises a fuse.

12. The method of claim 11, wherein the counter value represents a number of fuses blown as a result of the selectively applied electricity.

13. The method of claim 11, wherein the counter value represents a number of fuses not blown as a result of the selectively applied electricity.

14. The method of claim 7, wherein the PPEC comprises an antifuse.

15. The method of claim 14, wherein the counter value represents a number of antifuses blown as a result of the selectively applied electricity.

16. The method of claim 14, wherein the counter value represents a number of antifuses not blown as a result of the selectively applied electricity.

17. The method of claim 7, wherein storing the binary representation of the counter value in a PPEC signature comprises storing the number of fuses blown.

18. The method of claim 7, wherein storing the binary representation of the counter value in a PPEC signature comprises:
   evaluating an injective function that maps the number of fuses blown to a resultant value; and
   storing the resultant value in the PPEC signature.

19. At least one machine-readable medium including instructions for implementing fuse-based integrity protection, which when executed by a machine, cause the machine to:
   access a read-only memory (ROM) having a plurality of permanently programmable electric couplings (PPECs), all of the PPECs in an initial state;

selectively apply electricity to modify a set of PPECs of the plurality of PPECs from the initial state to a permanently altered state;

survey the number of permanently altered PPECs in the set of PPECs to produce a counter value;

store a binary representation of the counter value as PPEC values in a PPEC signature; and store a binary representation of the binary complement of the counter value as PPEC values in the PPEC signature.

20. The at least one machine-readable medium of claim 19, wherein the instructions to store the binary representation of the counter value in a PPEC signature comprise instructions to:

evaluate an injective function that maps the number of fuses blown to a resultant value; and store the resultant value in the PPEC signature.

* * * * *

UNITED STATES PATENT AND TRADEMARK OFFICE
CERTIFICATE OF CORRECTION

PATENT NO. : 9,875,806 B2
APPLICATION NO. : 15/443624
DATED : January 23, 2018
INVENTOR(S) : Michael Berger

Page 1 of 1

It is certified that error appears in the above-identified patent and that said Letters Patent is hereby corrected as shown below:

On the Title Page

In item (57), in "Abstract", in Column 2, Line 14, delete "partly," and insert --partly-- therefor Signed and Sealed this
Twenty-eighth Day of May, 2019

Andrei Iancu
*Director of the United States Patent and Trademark Office*